(12) United States Patent
Cheng et al.

(10) Patent No.: US 8,991,314 B2
(45) Date of Patent: Mar. 31, 2015

(54) ROLLER MICROCONTACT PRINTING DEVICE AND PRINTING METHOD THEREOF

(75) Inventors: Jung-Wei Cheng, Taipei (TW); Chang-Pen Chen, Kaohsiung (TW); Jeng-Rong Ho, Taipei (TW); Bo-Wei Li, Yunlin County (TW); Yeh-Min Lin, Kaohsiung (TW)

(73) Assignee: Metal Industries Research & Development Centre, Kaohsiung (TW)

( * ) Notice: Subject to any disclaimer, the term of this patent is extended or adjusted under 35 U.S.C. 154(b) by 1035 days.

(21) Appl. No.: 12/980,921

(22) Filed: Dec. 29, 2010

(65) Prior Publication Data

US 2012/0145019 A1    Jun. 14, 2012

(30) Foreign Application Priority Data

Dec. 13, 2010   (TW) .............................. 99143494 A

(51) Int. Cl.
| | | |
|---|---|---|
| B41F 31/02 | (2006.01) | |
| B41M 1/00 | (2006.01) | |
| H01L 51/00 | (2006.01) | |
| B05C 1/08 | (2006.01) | |
| H01L 23/00 | (2006.01) | |
| B05D 1/28 | (2006.01) | |
| H01L 51/56 | (2006.01) | |

(52) U.S. Cl.
CPC .............. *H01L 51/0001* (2013.01); *B41M 1/00* (2013.01); *B41F 31/02* (2013.01); *B05C 1/0813* (2013.01); *B05D 1/28* (2013.01); *H01L 24/11* (2013.01); *H01L 51/0004* (2013.01); *H01L 51/56* (2013.01); *H01L 2924/00013* (2013.01)

USPC .......................................................... 101/483

(58) Field of Classification Search
USPC .................. 101/35, 37, 6, 228, 267, 279, 483
See application file for complete search history.

(56) References Cited

U.S. PATENT DOCUMENTS

| | | | |
|---|---|---|---|
| 6,318,853 B1 * | 11/2001 | Asano et al. ................... | 347/103 |
| 6,840,175 B2 | 1/2005 | Battersby et al. | |
| 7,089,858 B2 | 8/2006 | Iwamoto | |
| 2007/0146460 A1 * | 6/2007 | Gordon et al. ................. | 347/103 |
| 2007/0176995 A1 * | 8/2007 | Kadomatsu et al. ........... | 347/103 |
| 2007/0246688 A1 * | 10/2007 | Sanchez et al. .......... | 252/299.01 |
| 2009/0046362 A1 * | 2/2009 | Guo et al. ...................... | 359/486 |
| 2009/0064886 A1 * | 3/2009 | Hook et al. .................... | 101/467 |

FOREIGN PATENT DOCUMENTS

| | | | | |
|---|---|---|---|---|
| JP | 2004291275 A | * | 10/2004 | ................. B41J 2/01 |
| JP | 2005186595 A | * | 7/2005 | ............. B41F 13/00 |
| TW | 200415207 | | 8/2004 | |
| TW | I257900 B | | 7/2006 | |

* cited by examiner

*Primary Examiner* — Daniel J Colilla
(74) *Attorney, Agent, or Firm* — Rosenberg, Klein & Lee

(57) ABSTRACT

A roller microcontact printing device and a printing method of the device are revealed. The roller microcontact printing device includes a transfer module with a transfer roller and a supply module. The supply module provides an isolating solution and a thin film material to the transfer module to form an isolation layer and a thin film layer in turn on the surface of the transfer roller. Then the thin film is transferred to a substrate by the transfer roller. The microcontact print device and method are used in a roll-to-roll printing process. Thus the production efficiency of the thin film layer on the substrate is improved and the cost is reduced.

9 Claims, 18 Drawing Sheets

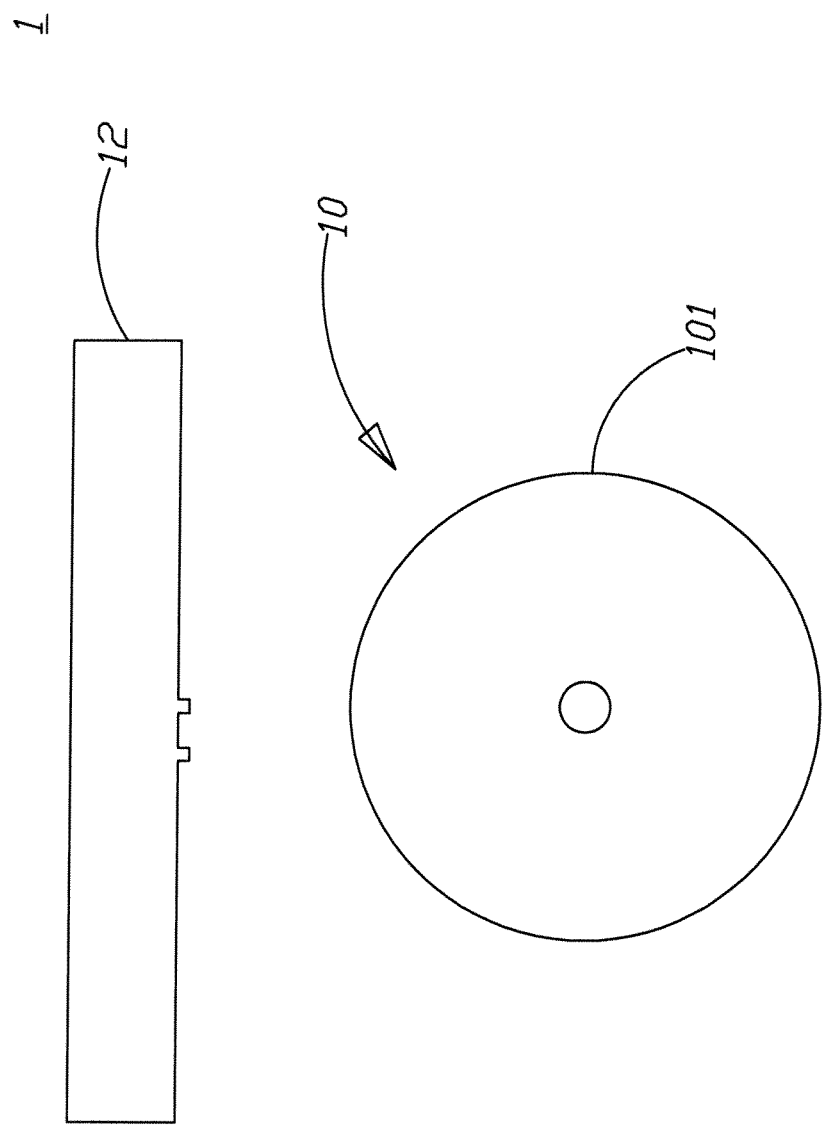

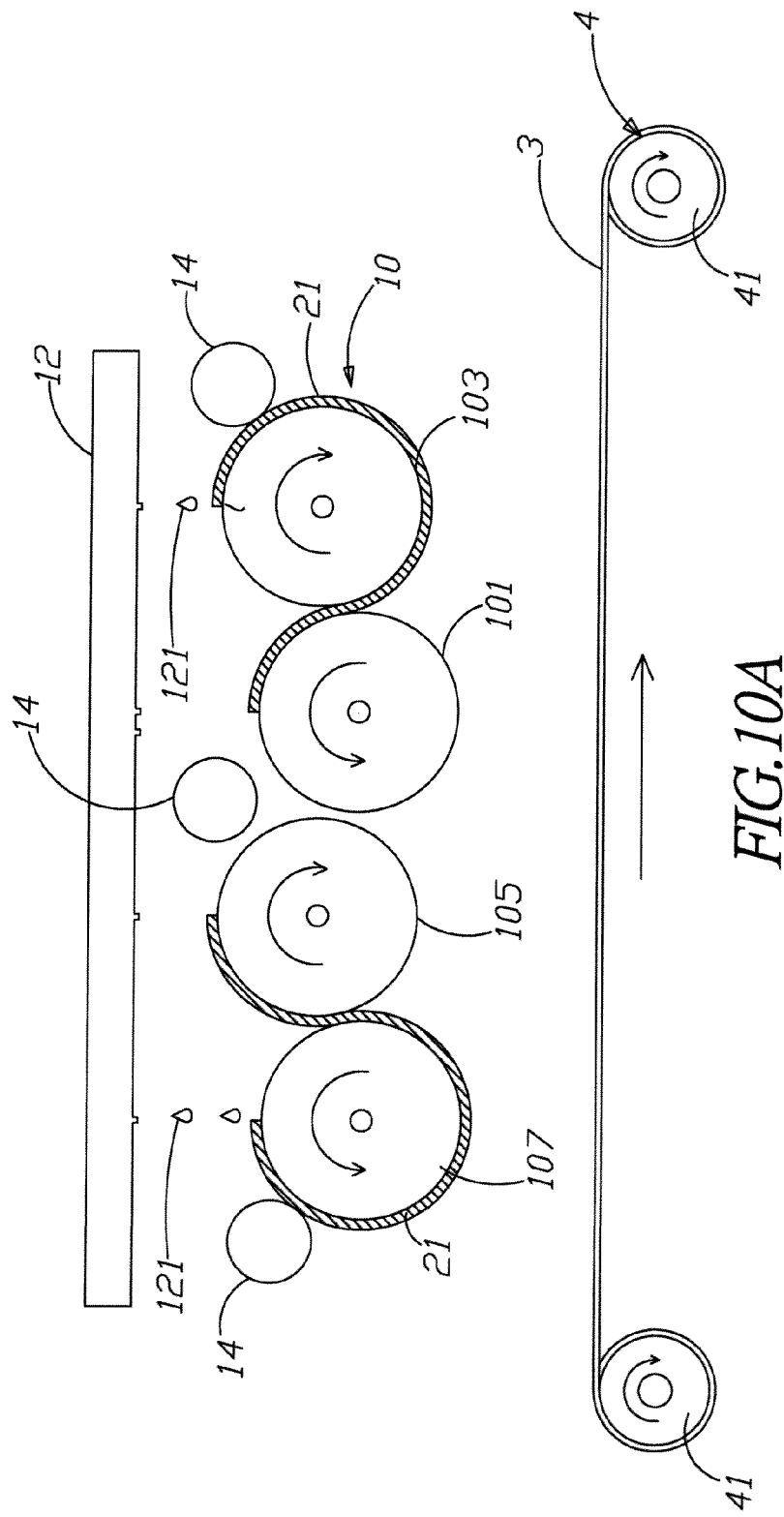

ROLLER MICROCONTACT PRINTING DEVICE AND PRINTING METHOD THEREOF

BACKGROUND OF THE INVENTION

1. Field of the Invention

The present invention relates to a microcontact printing device and a printing method thereof, especially to a roller microcontact printing device and a printing method thereof.

2. Descriptions of Related Art

In traditional manufacturing processes of organic thin films, the organic thin film is produced by various techniques such as thermal oxide growth in a furnace tube or chemical vapor phase deposition so as to deposit an organic thin film on a substrate. These are high temperature processes. This results in that the organic thin film is unable to be deposited on flexible substrate because primary flexible substrate candidates are plastics. The flexible substrate is not durable in high temperature environments and this limits fabrication of semiconductor components on the flexible substrate.

In order to solve above problems, the organic thin film can be printed on the substrate by transfer stamping. The printing methods available now include ink-jet printing, slot die coating, screen printing, letterpress printing, offset printing, gravure printing, and microcontact printing. Nowadays the manufacturing of semiconductor devices is down to micro- and nanometer-scale. Thus only microcontact printing in the above printing methods matches the requirement.

In a microcontact printing device, a layer of thin film material is deposited on a stamp. Then the stamp is brought into contact with a substrate and the thin film material is transferred to the substrate. However, the contact area of the stamp is unable to be adjusted. Once the surface area of the organic thin film is increased, a new stamp is prepared and this increases the cost. While transferring the thin film material to the substrate by the stamp, the feeding of the substrate needs to be stopped when the substrate is fed by a roll-to-roll conveyor. Thus it is impossible to carry out the automatic and continuous thin film production.

In order to solve above problems, there is a need to provide a roller microcontact printing device used in thin film production, especially in production of organic thin film. The organic thin film production is not necessary under high temperature conditions. There is no need to use chemical solution for etching. Thus the production cost is reduced effectively and the manufacturing is environmentally friendly.

Moreover, the roller microcontact printing device includes a transfer roller by which a thin film layer is transferred to the substrate. The transfer area of the transfer roller is determined by the number of laps the transfer roller rotates so that the transfer area is adjustable. This solves the problem of general stamp transfer printing with fixed transfer area. The roller microcontact printing device can be used and moved together with a roll-to-roll conveyor module an as to produce thin films continuously and automatically.

Normally, in order to transfer the patterns, roller type printing devices such as letterpress printing, offset printing, and gravure printing need back up pressure to act on the printing roller. That makes those printing devices have to be durable strength and structure. On contrast the roller microcontact printing based on the adhesion-work of the solutions, there is no need for the pressure force to transfer the patterns for this printing device, so the device would be able to have longer lifetime and more easy to maintain.

SUMMARY OF THE INVENTION

Therefore it is a primary object of the present invention to provide a roller microcontact printing device that transfers a thin film layer to a substrate by a transfer roller. The length of the thin film layer is determined according to a diameter and a number of laps of the transfer roller. Thus the area of the thin film layer is able to be adjusted by changing the diameter and the number of laps of the transfer roller. The problem of the stamp transfer printing that the area of the thin film layer transferred to the substrate is fixed can be solved.

It is another object of the present invention to provide a roller microcontact printing device for producing thin films, especially organic thin films. In the device, the thin film production is not run under high temperature and no chemical solution for etching is used. Thus the manufacturing cost is reduced and environmental friendliness is improved.

It is a further object of the present invention to provide a roller microcontact printing device used in combination with a roll-to-roll conveyor module. The action way of both devices is the same. Thus the thin films are produced continuously and automatically by the roller microcontact printing device of the present invention used together with the roll-to-roll conveyor module.

In order to achieve the above objects, a roller microcontact printing device of the present invention includes a transfer module having at least one transfer roller, and a supply module for providing an isolating solution and a thin film material to the transfer module. The transfer roller rotates no as to form an isolation layer and a thin film layer on its surface in turn. Then the thin film layer is transferred to a substrate by the transfer roller.

A printing method of the roller microcontact printing device according to the present invention includes following steps. Provide an isolating solution to a transfer module so as to form an isolation layer on a surface of a transfer roller of the transfer module. Provide a thin film material to the transfer module for producing a thin film layer on the isolation layer of the transfer roller. Next transfer the thin film layer to a substrate by the transfer roller.

BRIEF DESCRIPTION OF THE DRAWINGS

The structure and the technical means adopted by the present invention to achieve the above and other objects can be best understood by referring to the following detailed description of the preferred embodiments and the accompanying drawings, wherein:

FIG. 1 is a schematic drawing showing structure of an embodiment according to the present invention;

FIG. 10A and FIG. 10B are schematic drawings showing a further embodiment of the present invention in using state;

DETAILED DESCRIPTION OF THE PREFERRED EMBODIMENT

Figure 2A:
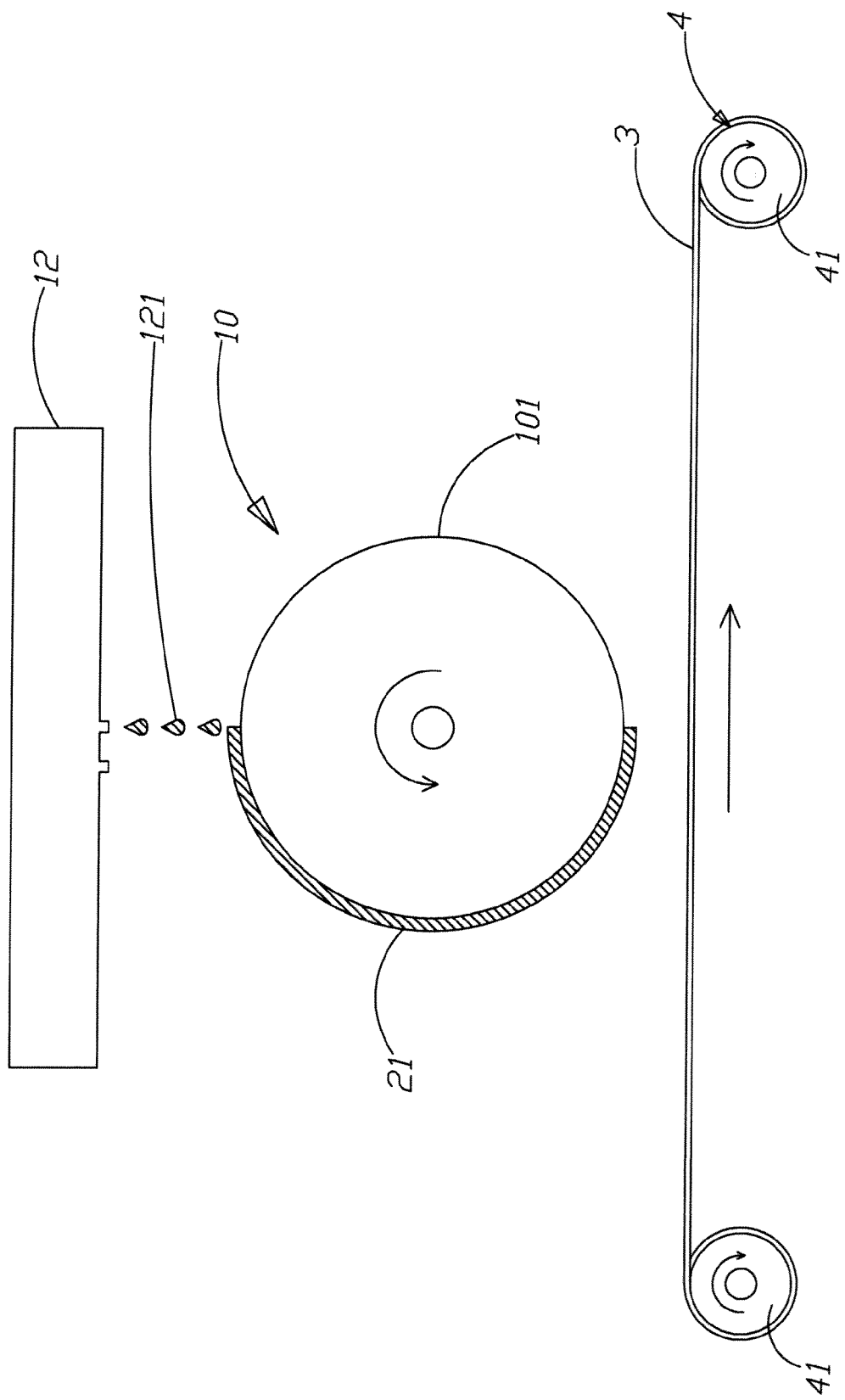
FIG. 2A and FIG. 2B are schematic drawings showing an embodiment of the present invention in using state.

A microcontact printing device includes a stamp coated with a thin film material. Then the thin film material is transferred to a substrate by the stamp. As to a roller microcontact printing device of the present invention, a thin film material is coated on a surface of a transfer roller. The transfer roller rotates so that the thin film material is transferred to the substrate. In the microcontact printing device, the area of the thin film material transferred to the substrate depends on the area of the stamp. The area of the stamp is unable to be increased or decreased. In the present invention, although the width of the thin film material transferred to the substrate by the transfer roller is fixed, the length of the thin film material is determined by the diameter of the transfer roller and the number of laps of the transfer roller. Thus the area of the thin film material transferred to the substrate can be modified according to the diameter of the transfer roller and the number of laps the transfer roller rotates. This can't be attained by general microcontact printing devices.

Moreover, the flexible substrate is usually sent by a roll-to-roll conveyor module. The microcontact printing device of the present invention uses the transfer roller for transferring the thin film material by rotation while the roll-to-roll conveyor module includes two rollers for rolling and conveying the substrate. The transfer roller and the roll-to-roll conveyor have the same action way. Thus the microcontact printing device of the present invention can be used together with the roll-to-roll conveyor module for automatic continuous production of thin films. The production efficiency is improved and the production cost is reduced due to mass production.

Referring to FIG. 1, a roller microcontact printing device 1 of the present invention includes a transfer module 10 and a supply module 12. In this embodiment, the supply module 12 is disposed above the transfer module 10 and the position of the supply module 12 can be changed according to practical applications. The supply module 12 provides an isolating solution and a thin film material to the transfer module 10. A preferred embodiment of the supply module 12 consists of a plurality of containers and fixtures. Each fixture clamps the corresponding container and the container is for receiving the isolating solution or the thin film material. The container can be a dropper, a syringe or other form of container that sends the isolating solution or the thin film material to the transfer module 10. The isolating solution is selected from followings: acetone, alcohols, benzenes or pure water.

In this embodiment, the transfer module 10 is formed by only a transfer roller 101. The supply module 12 provides the isolating solution and the thin film material to the transfer module 10 in turn. The isolating solution is used to form an isolation layer on the surface of the transfer roller 101 firstly. Then the thin film material is covered over the isolation layer to form a thin film layer stacked over the isolation layer. The transfer roller 101 is made from polydimethylsiloxane (PDMS) or other materials with very low interfacial free energy.

Figure 2B:
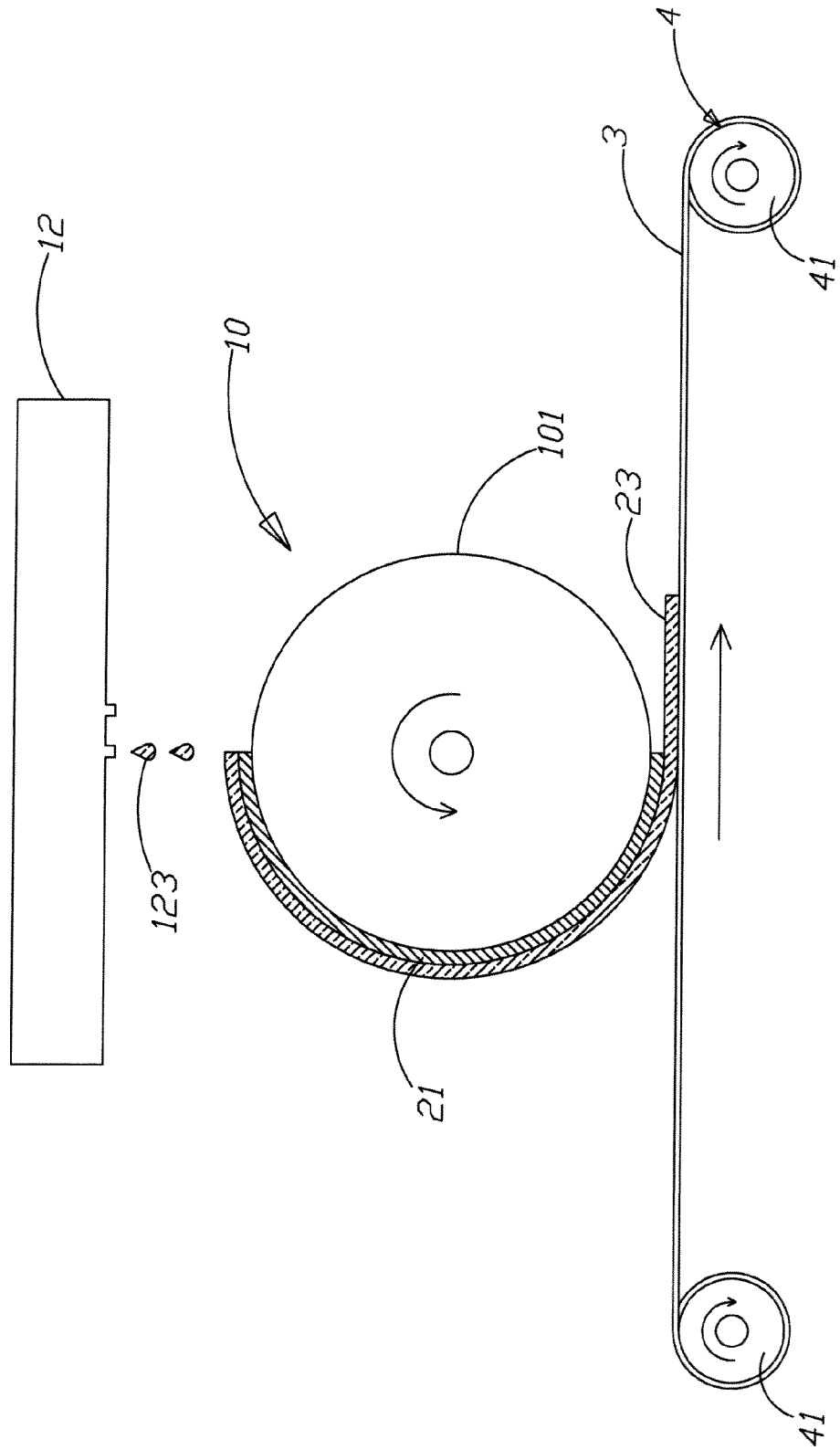
Figure 3:
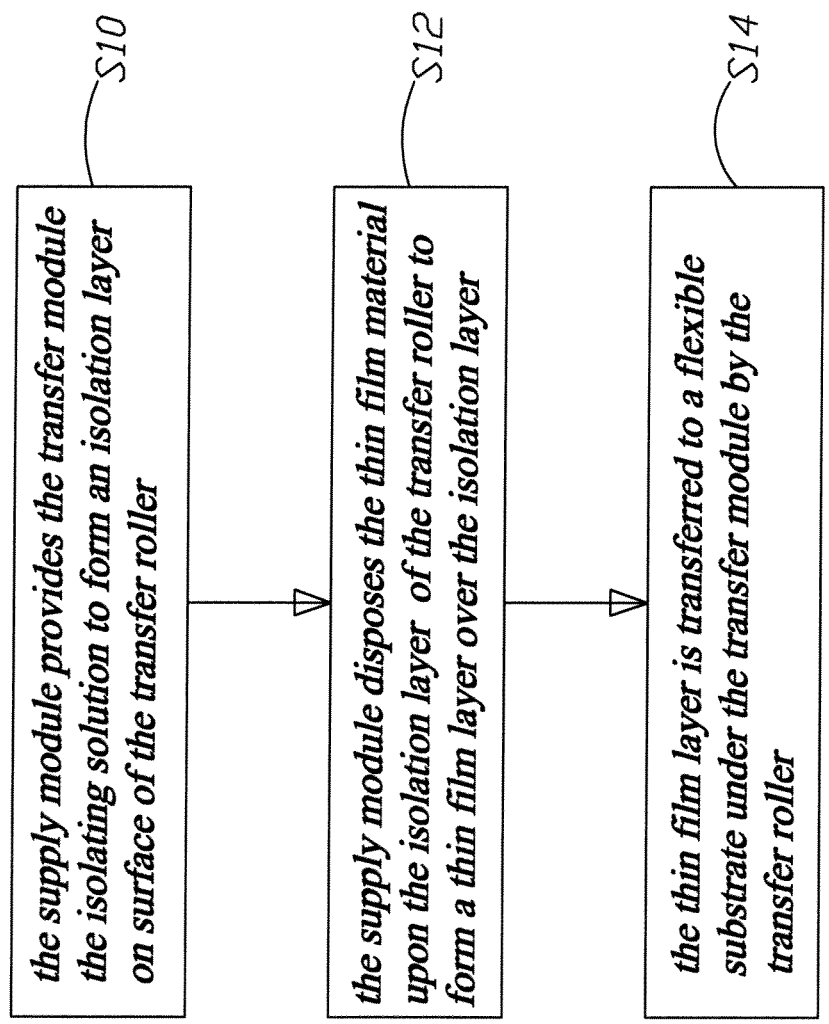
FIG. 3 is a flow chart of an embodiment according to the present invention.

Referring to FIG. 2A, FIG. 2B and FIG. 3, both a using state diagram and a flow chart of an embodiment are revealed. Before producing the thin film by the roller microcontact printing device 1, the surface of the transfer roller 101 is modified by air plasma treatment. The advantage of the air plasma treatment is that the treatment is not necessary to be performed under vacuum. Thus there is no limit on the size of the transfer module 10 and the area of the transfer roller 101 is also not restricted. The surface of the transfer roller 10 modified by air plasma treatment has high interfacial free energy for absorption of the isolating solution 121 dropped on the surface of the transfer roller 101 later.

After the surface of the transfer roller 101 being treated by air plasma, the roller microcontact printing device 1 of the present invention is used to fabricate the thin film. Firstly, take the step S10, the supply module 12 provides the transfer module 10 the isolating solution 121 to form an isolation layer 121 on surface of the transfer roller 101. Then take the step S12, the supply module 12 disposes the thin film material 123 upon the isolation layer 21 of the transfer roller 101 to form a thin film layer 23 over the isolation layer 21.

At last, take the step S14, the thin film layer 23 is transferred to a flexible substrate 3 under the transfer module 10 by the transfer roller 101. The interaction between the thin film layer 23 and the substrate 3 is larger than the interaction between the thin film layer 23 and the isolation layer 21. Moreover, the surface of the transfer roller 101 modified by air plasma treatment having high free energy absorbs the isolation layer 21. And the thin film layer 23 floats on the isolation layer 21 so as to be transferred to the flexible substrate 3 smoothly. The function of the isolation layer 21 is to enable the film layer 23 being transferred to the flexible substrate 3 completely without leaving any residue of the film layer 23 on the transfer roller 101. Thus the use of the isolation layer 21 increases the precision of transferring of the transfer roller 101. After several times of the transfer processes, the surface of transfer roller 101 originally with high free energy turns back to low free energy state. At that time, for performing the next transfer process, the surface of the transfer roller 101 is treated by air plasma again.

This embodiment of the roller microcontact printing device 1 can be used to produce thin films, especially to organic semiconductor thin film devices such as organic thin film solar cells, organic thin film transistors, or organic light-emitting diodes. The conventional way for manufacturing organic thin films is performed under high vacuum and high temperature environment. However, once the organic thin film is intended to be formed on the flexible substrate 3, the manufacturing process is unable to be run under high temperature. Thus the thin film layer 23 is transferred to the flexible substrate 3 by the printing of the roller microcontact printing device and the printing process is not necessary run under high clean level, high vacuum and high temperature. Therefore, the thin film applications on the flexible substrate 3 are not restricted.

In this embodiment, while the thin film layer 23 being transferred to the flexible substrate 3 by the transfer roller 101, the transfer roller 101 needs to be moved forward or backward for transferring the film layer 23 to the flexible substrate 3 once the flexible substrate 3 is placed statically. For rotation of the transfer roller 101 around a fixed point, a conveyor module 4 is required to send the flexible substrate 3. The conveyor module 4 moves the flexible substrate 3 forward according to the rotation speed of the transfer roller 101. A preferred embodiment of the conveyor module 4 is a roll-to-roll conveyor module that includes two rollers 41. Each of two ends of the flexible substrate 3 is wound around the two rollers 41 respectively. The two rollers 41 rotate to drive the flexible substrate 3 moving forward. The action way of the two rollers 41 is the same as that of the transfer roller 101.

Thus automatic production of the thin film is attained by adjustment of rotation speed of both the two rollers 41 and the transfer roller 101.

Figure 4:
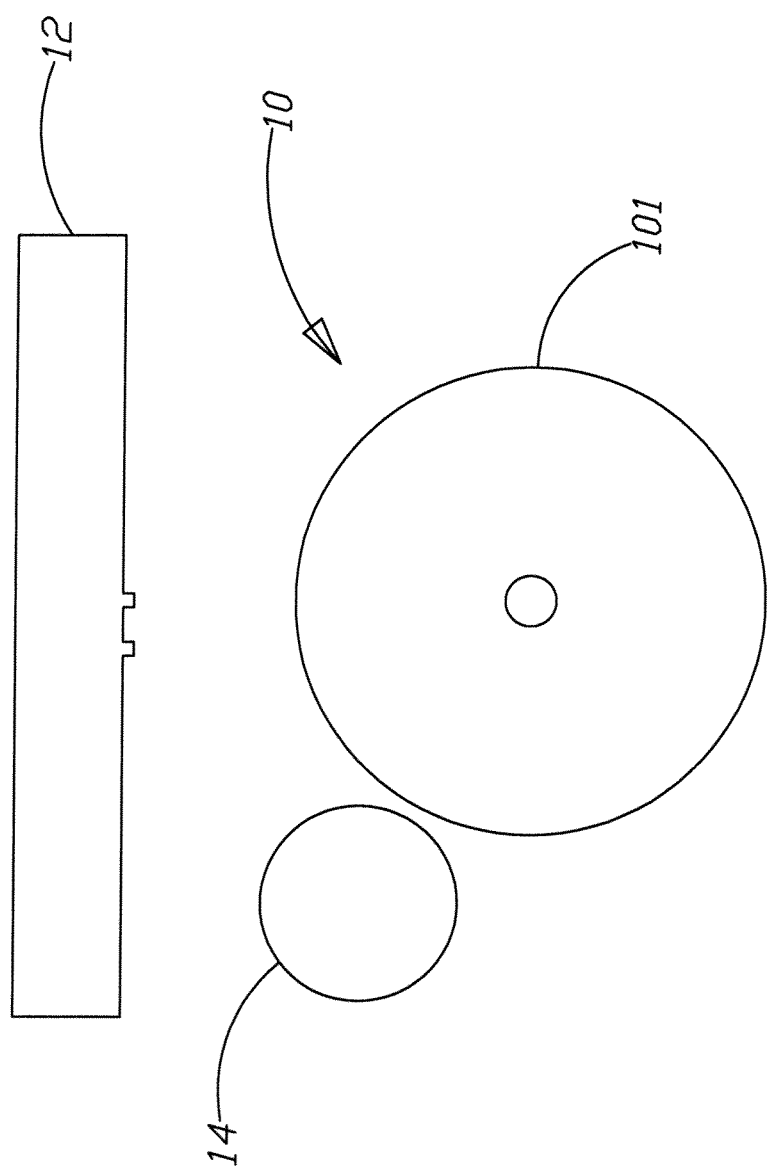
FIG. 4 is a schematic drawing showing structure of another embodiment according to the present invention.

Referring to FIG. 4, another embodiment is revealed. As shown in the figure, the roller microcontact printing device 1 further includes a film thickness control member 14 located on one side of the transfer roller 101. There is a preset distance between the film thickness control member 14 and the transfer roller 101. The preset distance is equal to the thickness of the isolation layer and/or the thin film layer. Thus the film thickness control member 14 controls the thickness of the isolation layer and/or the thin film layer according to the preset distance.

Take the control of the thickness of the isolation layer 21 formed on the transfer roller 101 as an example. The preset distance between the film thickness control member 14 and the transfer roller 101 is adjusted according to the thickness of the isolation layer 21. The film thickness control member 14 presses the isolation layer 21 formed on the transfer roller 101. Along with the rotation of the transfer roller 101, the film thickness control member 14 removes the redundant isolation layer 21 so as to make the thickness of the isolation layer 21 match the preset distance.

A preferred embodiment of the film thickness control member 14 is a floating joint and a semi-circular roller connected with one end of the floating joint. There is a preset distance between one end of the semi-circular roller and the transfer roller 101. The preset distance can be controlled by arrangement of at least one counter weight block at the semi-circular roller. This is only an embodiment of the film thickness control member 14 and there are other embodiments.

Figure 5:
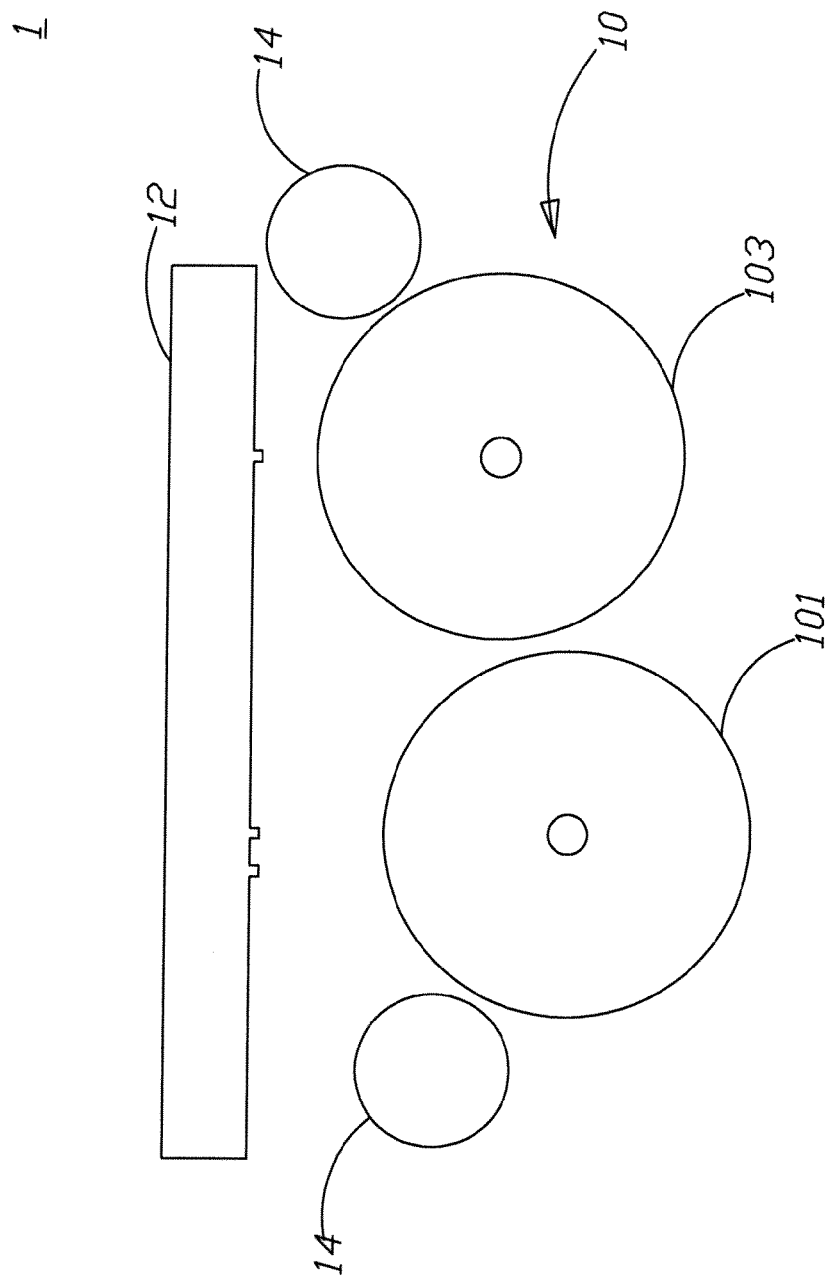
FIG. 5 is a schematic drawing showing structure of a further embodiment according to the present invention.
Figure 6A:
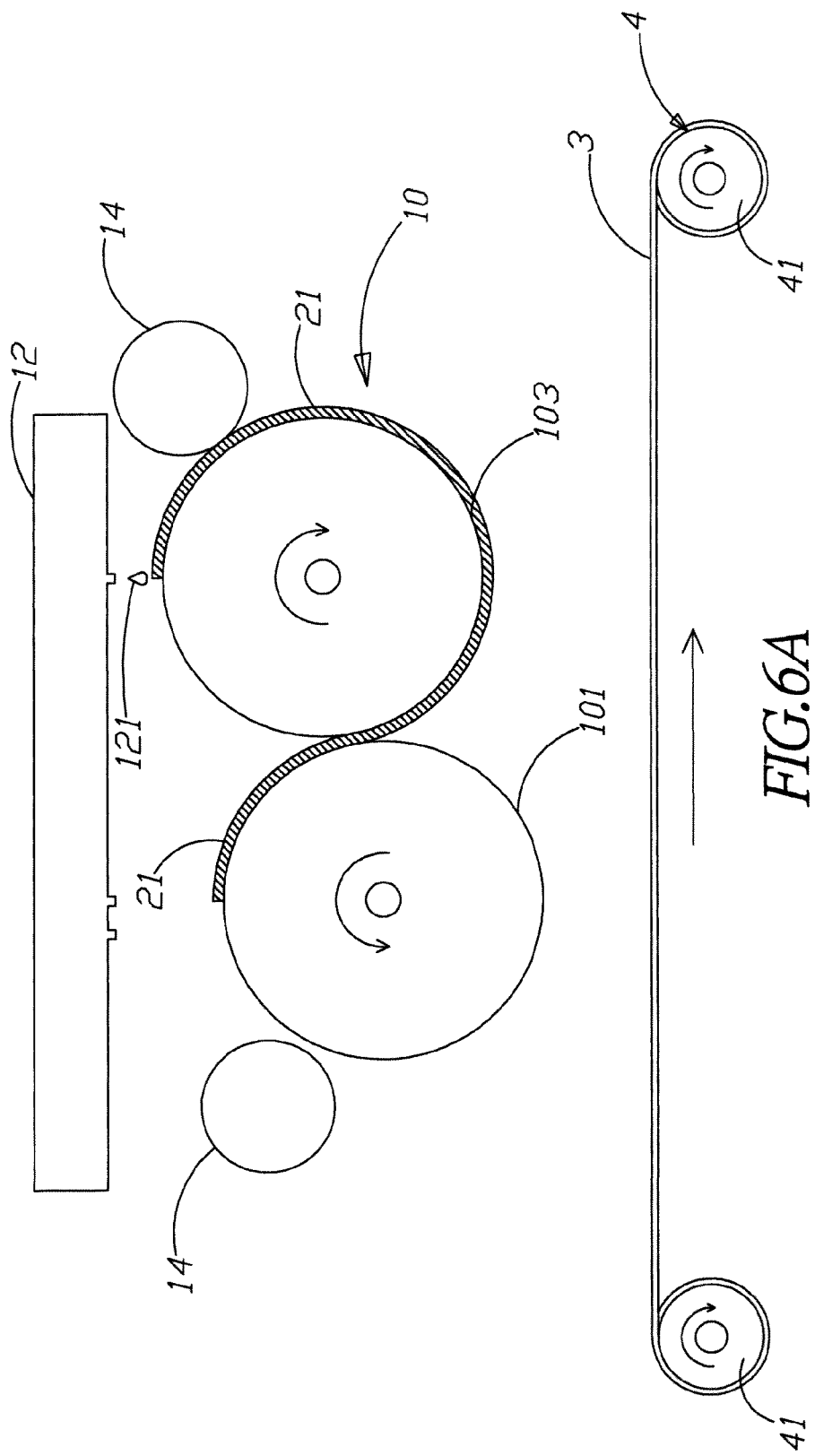
FIG. 6A and FIG. 6B are schematic drawings showing a further embodiment of the present invention in using state.
Figure 6B:
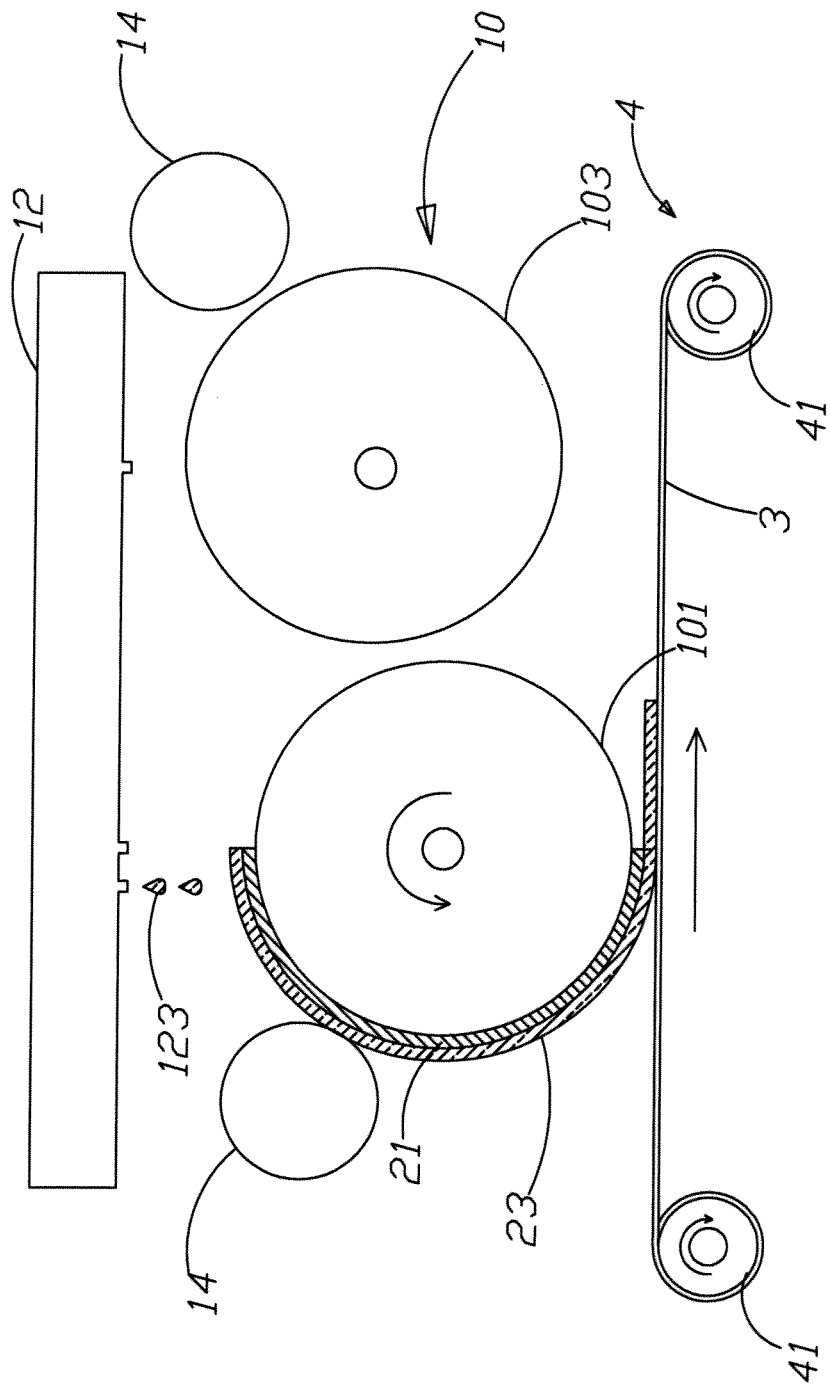

Referring to FIG. 5, FIG. 6A and FIG. 6B, a further embodiment is revealed. The isolation layer 21 and/or the thin film layer 23 stacked on the transfer roller can be transferred from other roller. In this embodiment, the transfer module 10 of the roller microcontact printing device 1 further includes a first roller 103. In the beginning, an isolation layer 21 is formed on a surface of the first roller 103. Then the isolation layer 21 is transferred to the surface of the transfer roller 101 by the first roller 103. The first roller 103 is arranged at one side of the transfer roller 101. The supply module 12 provides the isolating solution 121 to the surface of the first roller 103 so as to form the isolation layer 21 on the surface of the first roller 103. Along with the rotation of the transfer roller 101, the first roller 103 is also driven to rotate. Thus the isolation layer 21 on the first roller 103 is transferred to the surface of the transfer roller 101. Next the supply module 12 provides the thin film material 123 to the isolation layer 21 of the transfer roller 101 no as to form a thin film layer 23 on the isolation layer 21 of the transfer roller 101. The isolation layer 21 has been transferred from the first roller 103 to the transfer roller 101. At last, the thin film layer 23 is transferred to the flexible substrate 3 by the transfer roller 101.

According to the embodiment in FIG. 4, the film thickness control member 14 is disposed on one side of the transfer roller 101. The film thickness control member 14 of this embodiment is arranged at one side of the first roller 103. In this embodiment, the isolation layer 21 is formed on the first roller 103 firstly and then is transferred to the transfer roller 101 by the first roller 103. Thus it's better to adjust the thickness of the isolation layer 21 on the first roller 103 than to adjust the thickness of the isolation layer on the transfer roller 101. Therefore, this embodiment further includes the other film thickness control member 14 particularly disposed on one side of the first roller 103. How the film thickness control member 14 controls the thickness of the isolation layer 21 has been revealed in the above embodiment.

Before or during the thin-film manufacturing process run by the roller microcontact printing device 1, both the surface of the transfer roller 101 and the surface of the first roller 103 of the transfer module 10 are modified by air plasma treatment. In the following embodiment, the surface of each roller of the transfer module 10 can also be treated by air plasma before or during thin-film fabrication. Thus the surface of each roller remains in high free energy state during the thin-film manufacturing and this favors following thin-film production processes.

Figure 7:
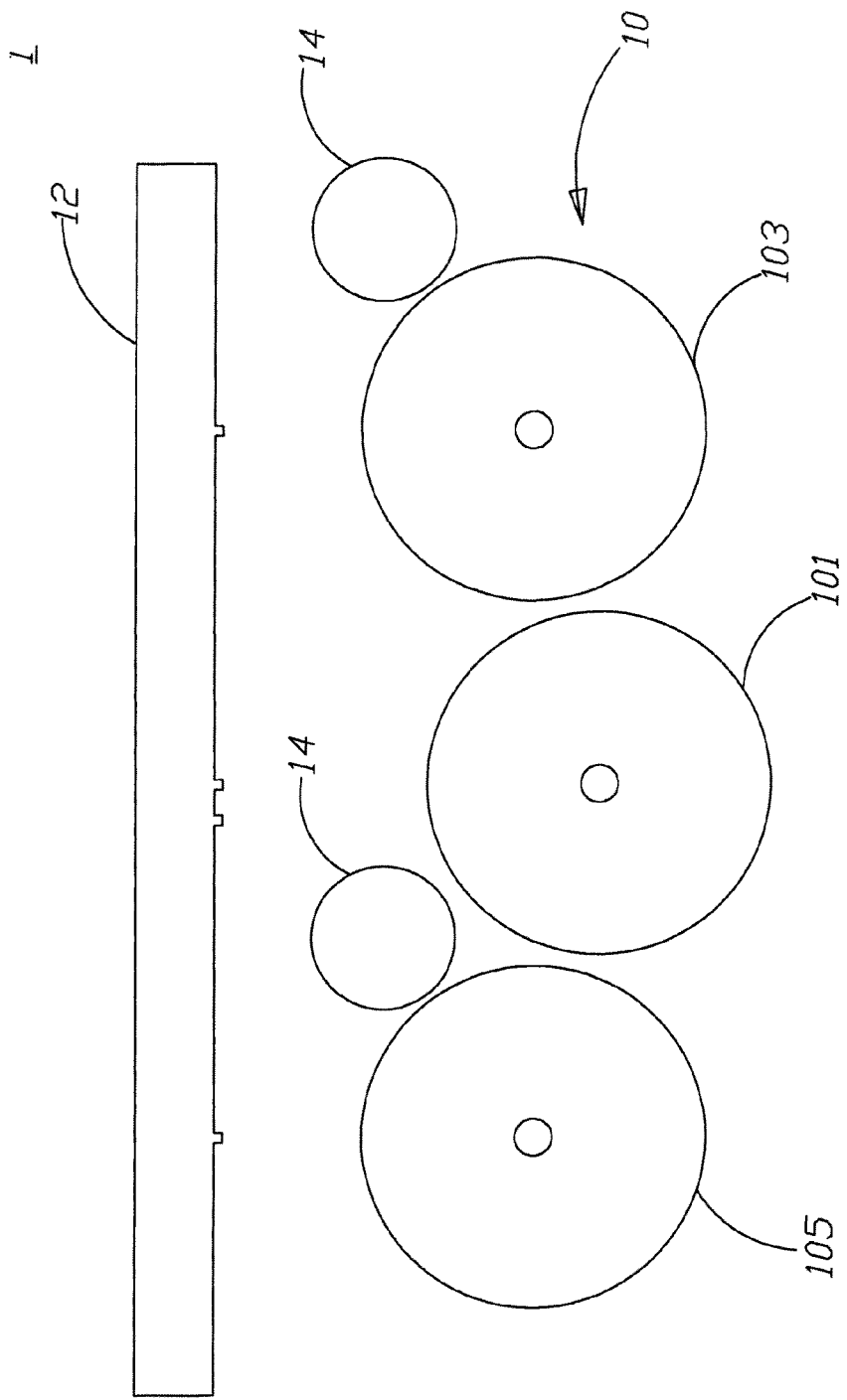
FIG. 7 is a schematic drawing showing structure of a further embodiment according to the present invention.
Figure 8A:
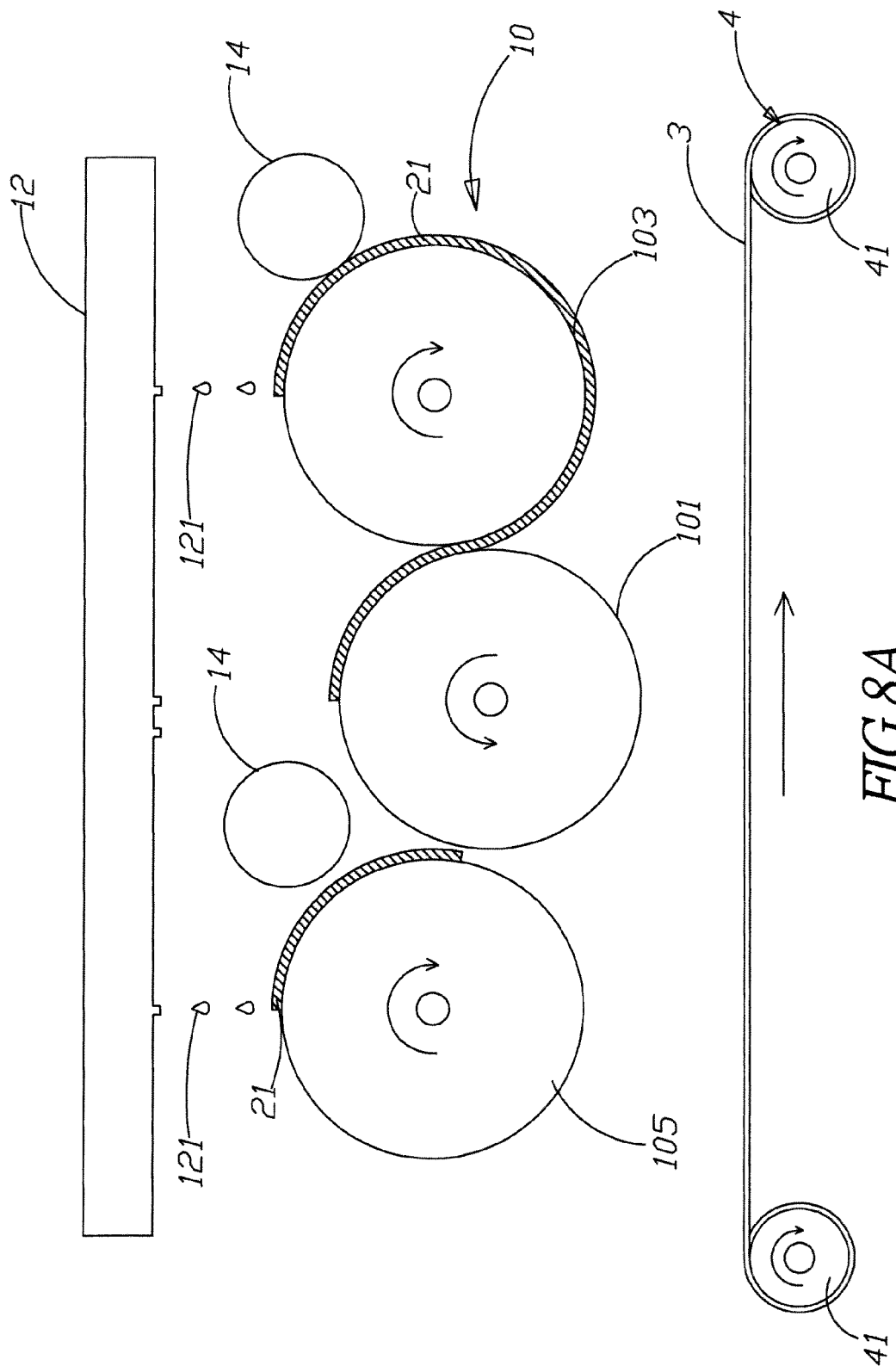
FIG. 8A and FIG. 8B are schematic drawings showing a further embodiment of the present invention in using state.
Figure 8B:
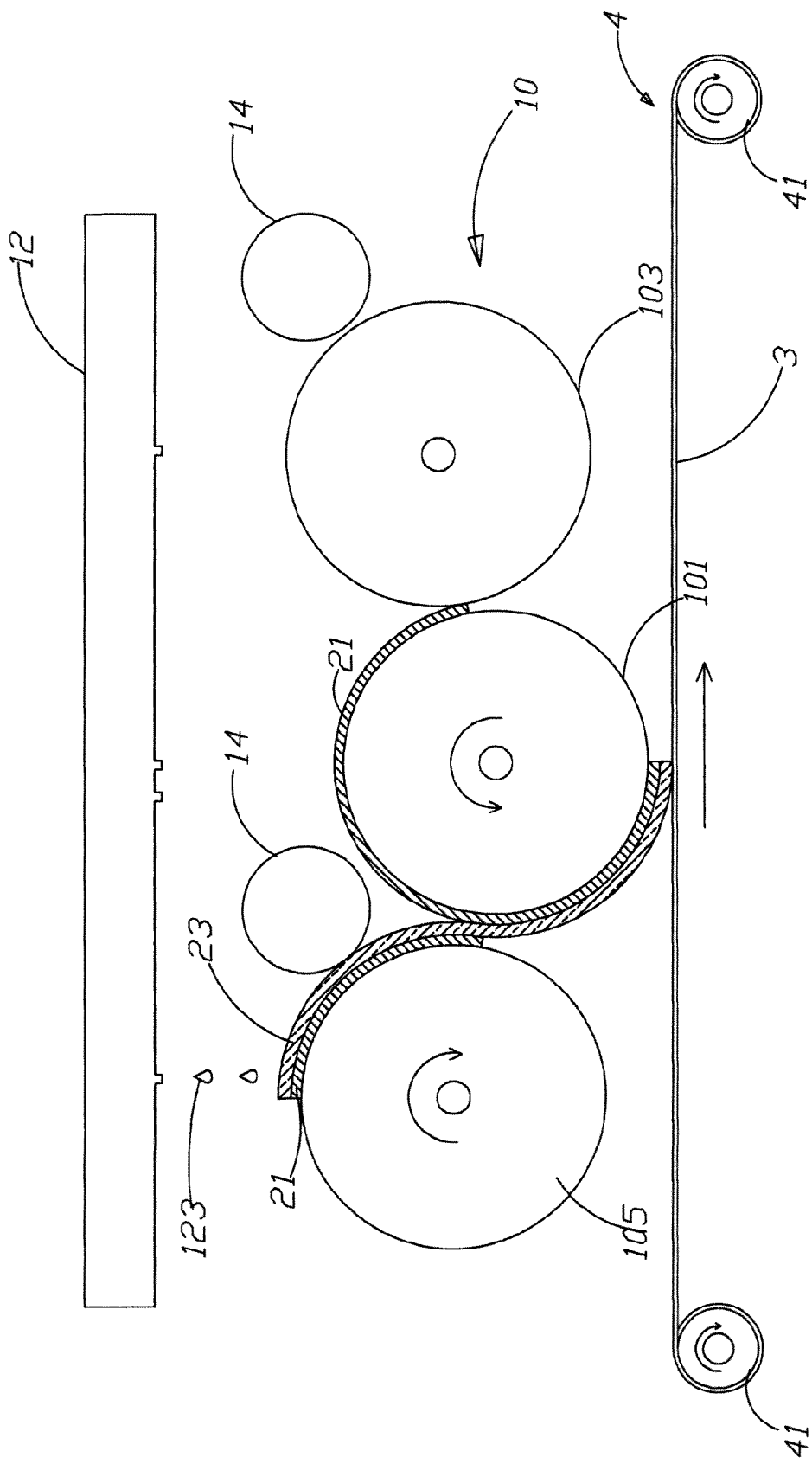

Referring to FIG. 7, FIG. 8A and FIG. 8B, a further embodiment is revealed. In the embodiment in FIG. 5, the isolation layer 21 is transferred to the surface of the transfer roller 101 by the first roller 103. The transfer module 10 of this embodiment further includes a second roller 105 located on the other side of the transfer roller 101, corresponding to the first roller 103. The second roller 105 is used to transfer a thin film layer 23 to the surface of the transfer roller 101. Thus this thin film layer 23 should be formed on the second roller 105 in advance. Before the step of forming the thin film layer 23 on the second roller 105, another isolation layer 21 should be produced on the surface of the second roller 105 so that the thin film layer 23 can be transferred to the transfer roller 101 completely. The isolation layer 21 formed on the second roller 105 improves transfer precision of the second roller 105.

The transfer roller 101 rotates and also drives both the first roller 103 and the second roller 105 to rotate. An isolation layer 21 is formed on the surface of the first roller 103. The isolation layer 21 of the first roller 103 is transferred to the surface of the transfer roller 101. The details have been described in the above embodiment. At the same time, the supply module 12 also provides the isolating solution 121 to the second roller 105 to form the other isolation layer 21 on the surface of the second roller 105. Then the supply module 12 provides the thin film material 123 to the second roller 105 so that the thin film layer 23 is formed on the isolation layer 21 of the second roller 105. After the isolation layer 21 of the first roller 103 being transferred to the surface of the transfer roller 101, the thin film layer 23 is transferred to the isolation layer 21 of the transfer roller 101 by the second roller 105. Next the thin film layer 23 is transferred to the substrate 3 by the transfer roller 101.

This embodiment of the roller microcontact printing device 1 can be used to manufacture patterned thin film. In the beginning, a figure of the thin film is patterned on the surface of the transfer roller 101 of the transfer module 10. If only the transfer roller 101 is used to transfer a patterned thin film layer to the flexible substrate 3, some problems occur. When the supply module 12 provide the isolating solution 121 and the thin film material 123 to the patterned transfer roller 101, both the isolating solution 121 and the thin film material 123 fall into concave part of the pattern. And the patterned thin film layer is difficult to be released from the transfer roller 101 completely. Thus other roller is required for transferring the thin film layer 23 to the patterned transfer roller 101 on as to form the patterned thin film layer. Then the patterned thin film layer is transferred to the flexible substrate 3 by the transfer roller 101.

Back to FIG. 7, one side of the second roller 105 is also disposed with a film thickness control member 14. The film thickness control member 14 is used to control the thickness of the isolation layer 21 and/or the thin film layer 23 formed on the second roller 105. How the film thickness control member 14 controls the thickness has been revealed in the embodiment shown in FIG. 4. Moreover, the film thickness control member 14 is arranged on one side of both the first roller 103 and the second roller 105. That means the thickness of the isolation layer 21 formed on the first roller 103 and the thickness of the thin film layer 23 formed on the second roller 105 are both adjusted to proper thickness. Thus the film thickness control member 14 arranged beside the transfer roller 101 can be omitted.

The first roller 103 of this embodiment can also be omitted. The supply module 12 directly provides the isolating solution 121 to the surface of the transfer roller 101 so that the isolation layer 21 is formed on the surface of the transfer roller 101. Then the thin film layer 23 on the second roller 105 is transferred to the isolation layer 21 of the transfer roller 101. At last the thin film layer 23 is transferred to the flexible substrate 3 by the transfer roller 101.

Figure 9:
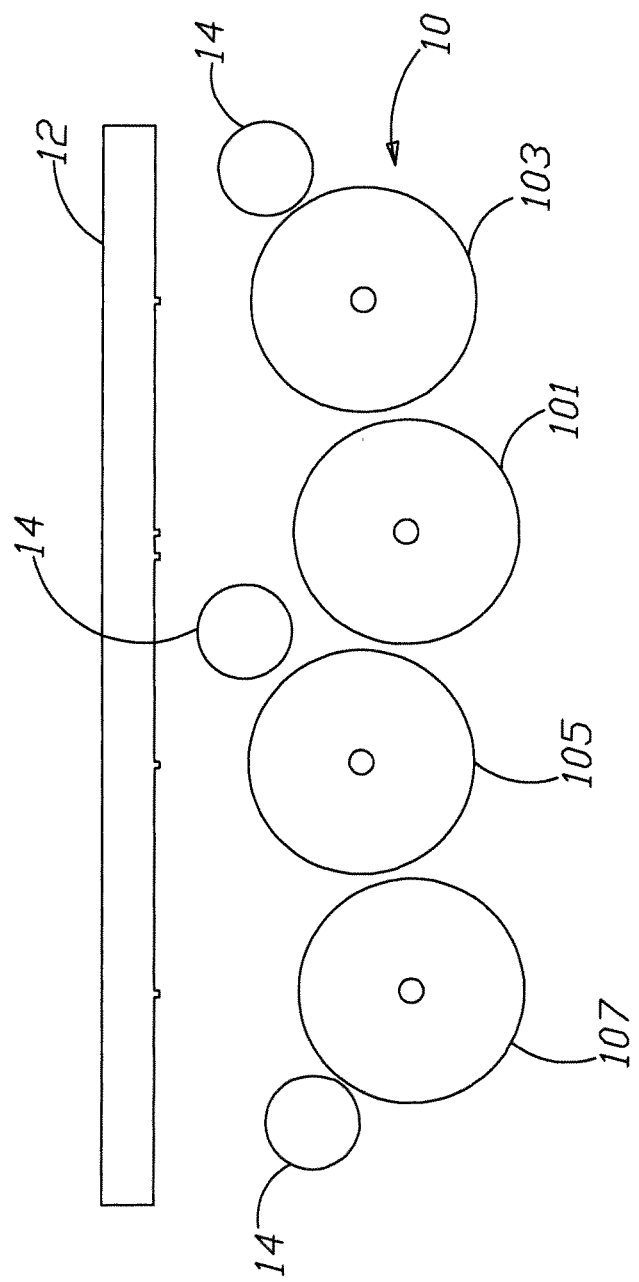
FIG. 9 is a schematic drawing showing structure of a further embodiment according to the present invention.
Figure 10B:
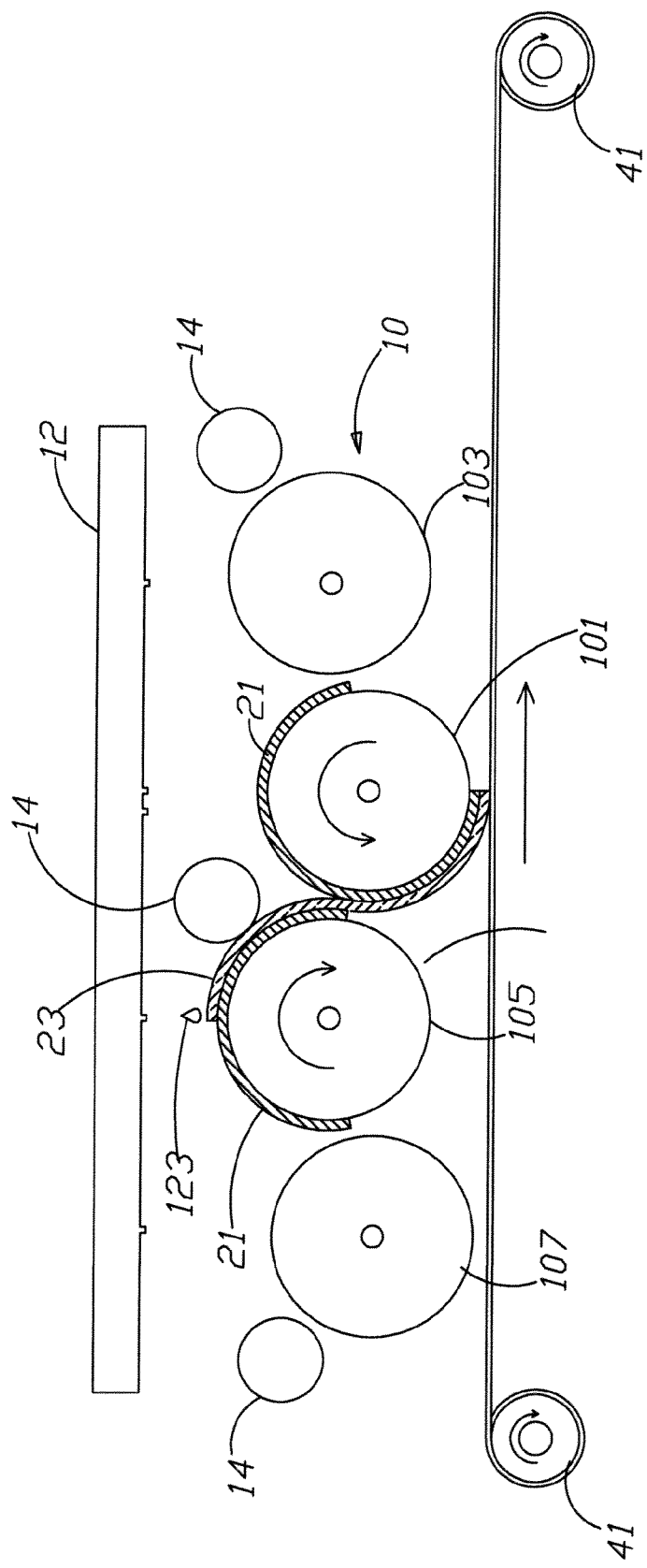

Referring to FIG. 9, FIG. 10A, and FIG. 10B, a further embodiment is revealed. In the embodiment shown in FIG. 7, the supply module 12 provides the isolating solution 121 and the thin film material 123 to the second roller 105 so as to form the isolation layer 21 and the thin film layer 23 on the second roller 105 in turn. The difference between this embodiment and the one in FIG. 7 is in that the transfer module 10 of this embodiment further includes a third roller 107 located on one side of the second roller 105 and used for transferring another isolation layer 21 to the surface of the second roller 105. Then the supply module 12 provides the thin film material 123 to the second roller 105 so as to form a thin film layer 23 on the isolation layer 21 of the second roller 105. The thin isolation layer 21 has been transferred from the third roller 107 to the second roller 105. The action way of the second roller 105 and the third roller 107 is as the embodiment shown in FIG. 5. Finally, the thin film layer 23 on the second roller 105 is transferred to the isolation layer 21 of the transfer roller 101. And the thin film layer 23 is further transferred to the flexible substrate 3 by the transfer roller 101.

In the above embodiment, the driving way of the rollers in the transfer module 10 is based on a driving device. The transfer roller 101 is driven to rotate by the driving device and other rollers are driven to rotate by the transfer roller 101.

Figure 11:
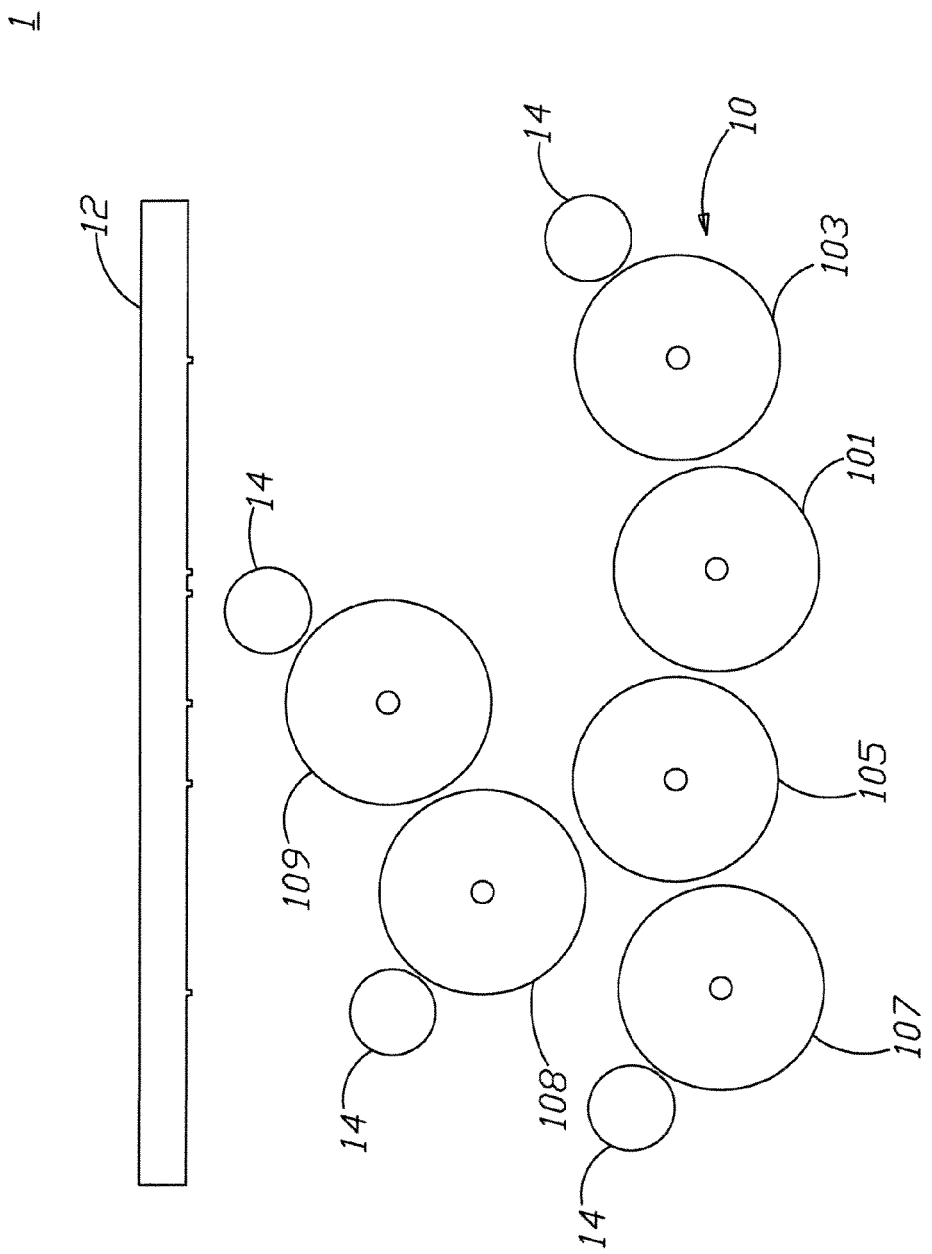
FIG. 11 is a schematic drawing showing structure of a further embodiment according to the present invention.
Figure 12A:
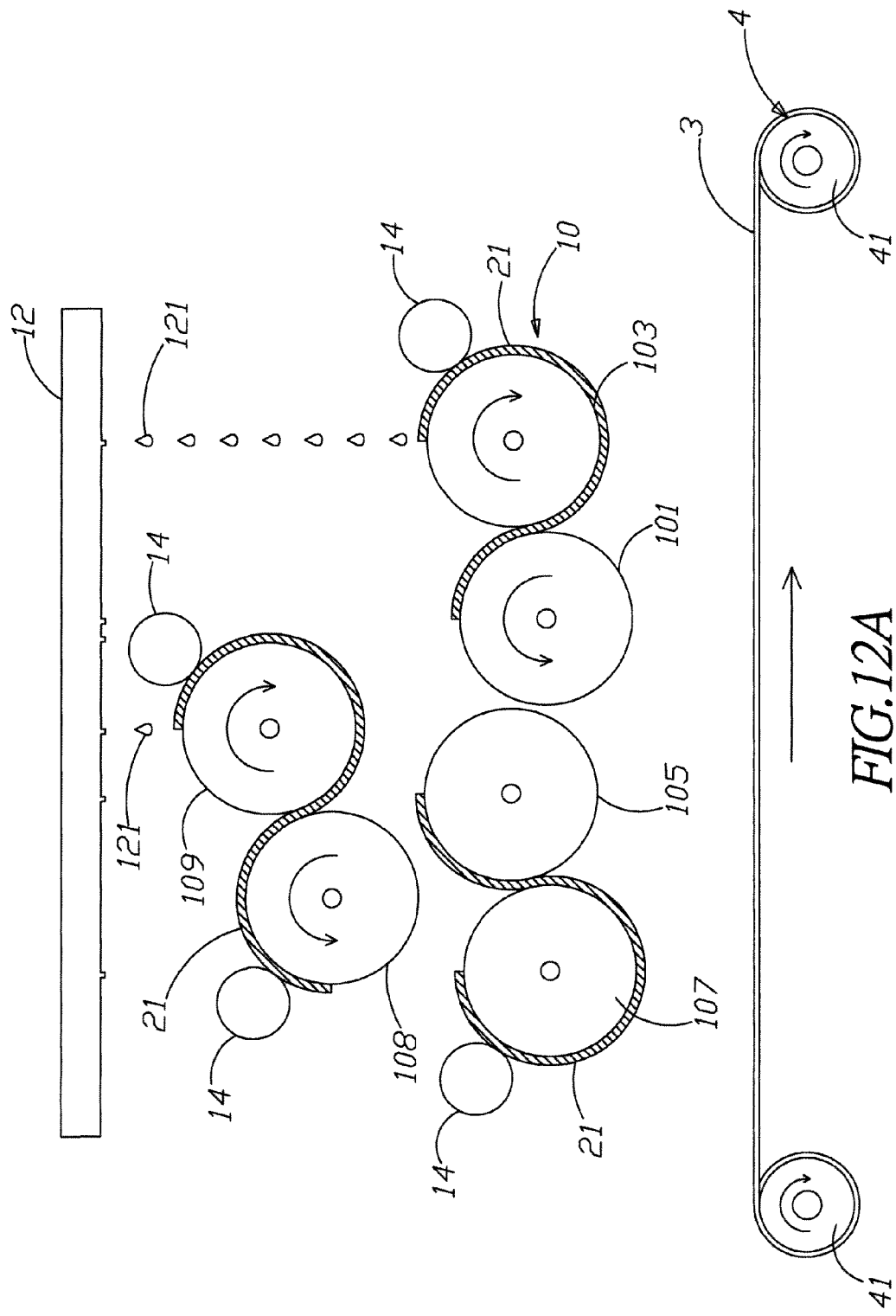
FIG. 12A and FIG. 12B are schematic drawings showing a further embodiment of the present invention in using state.
Figure 12B:
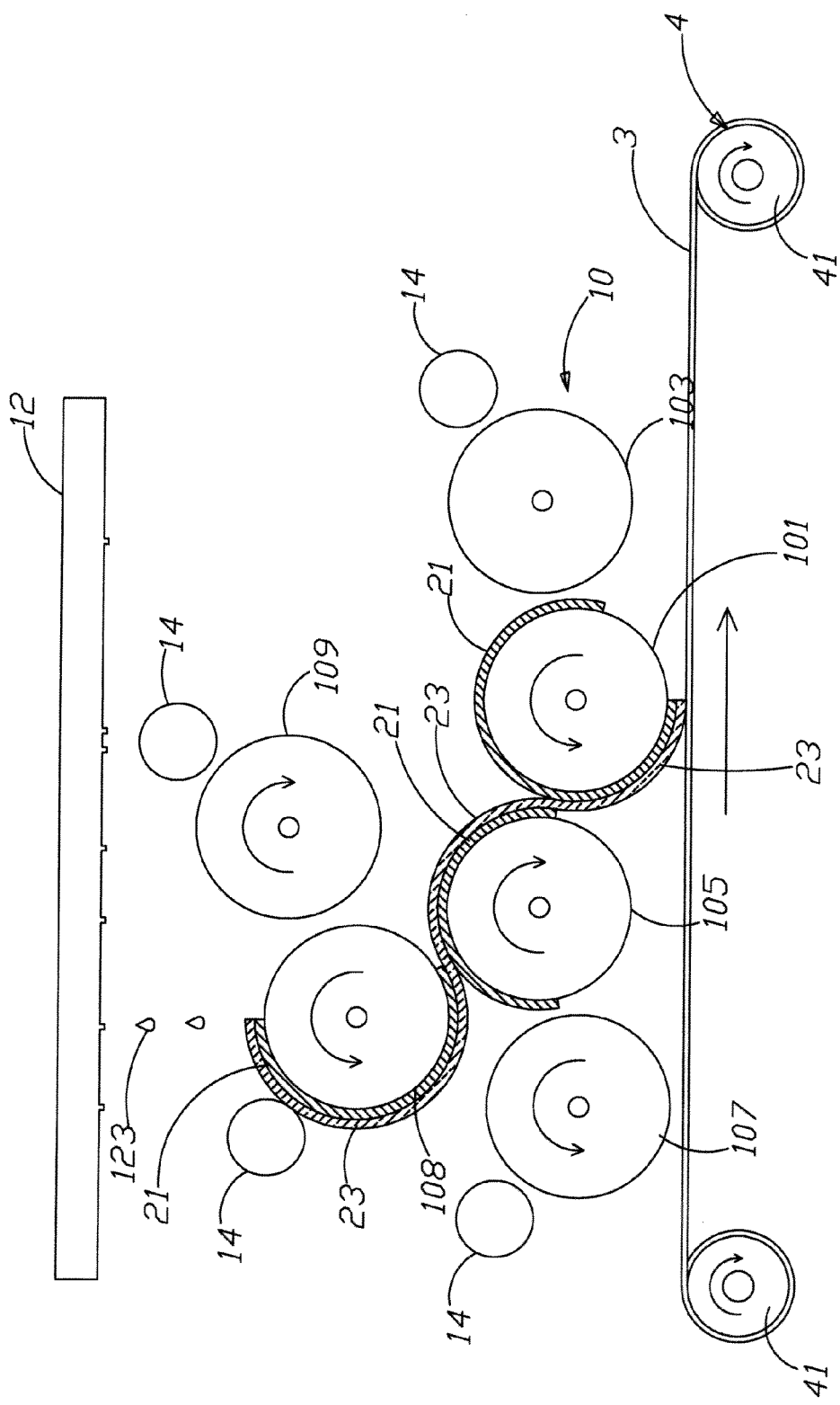

Referring to FIG. 11, FIG. 12A and FIG. 12B, a further embodiment is disclosed. The supply module 12 of the embodiment shown in FIG. 9 provides the thin film material 123 to the isolation layer 21 of the second roller 105 so as to form the thin film layer 23 on the isolation layer 21 of the second roller 105. The difference between this embodiment and the one in FIG. 9 is in that the transfer module 10 of this embodiment further includes a fourth roller 108 and a fifth roller 109. The fourth roller 108 is arranged at one side of the second roller 105 and there is a preset distance between the fourth roller 108 and the second roller 105. As to the fifth roller 109, it is located on one side of the fourth roller 108 and used for transferring a further isolation layer 21 to the surface of the fourth roller 108. Then the supply module 12 provides the thin film material 123 to the fourth roller 108 so as to form the thin film layer 23 on the isolation layer 21 of the fourth roller 108. Next the thin film layer 23 is transferred to the isolation layer 21 of the second roller 105. At last, the thin film layer 23 of the second roller 105 is further transferred to the isolation layer 21 of the transfer roller 101. Then the thin film layer 23 is transferred to the flexible substrate 3 by the transfer roller 101. How the isolation layer 21 is formed on the transfer roller 101 and on the second roller 105 has been described in the above embodiment.

Figure 13:
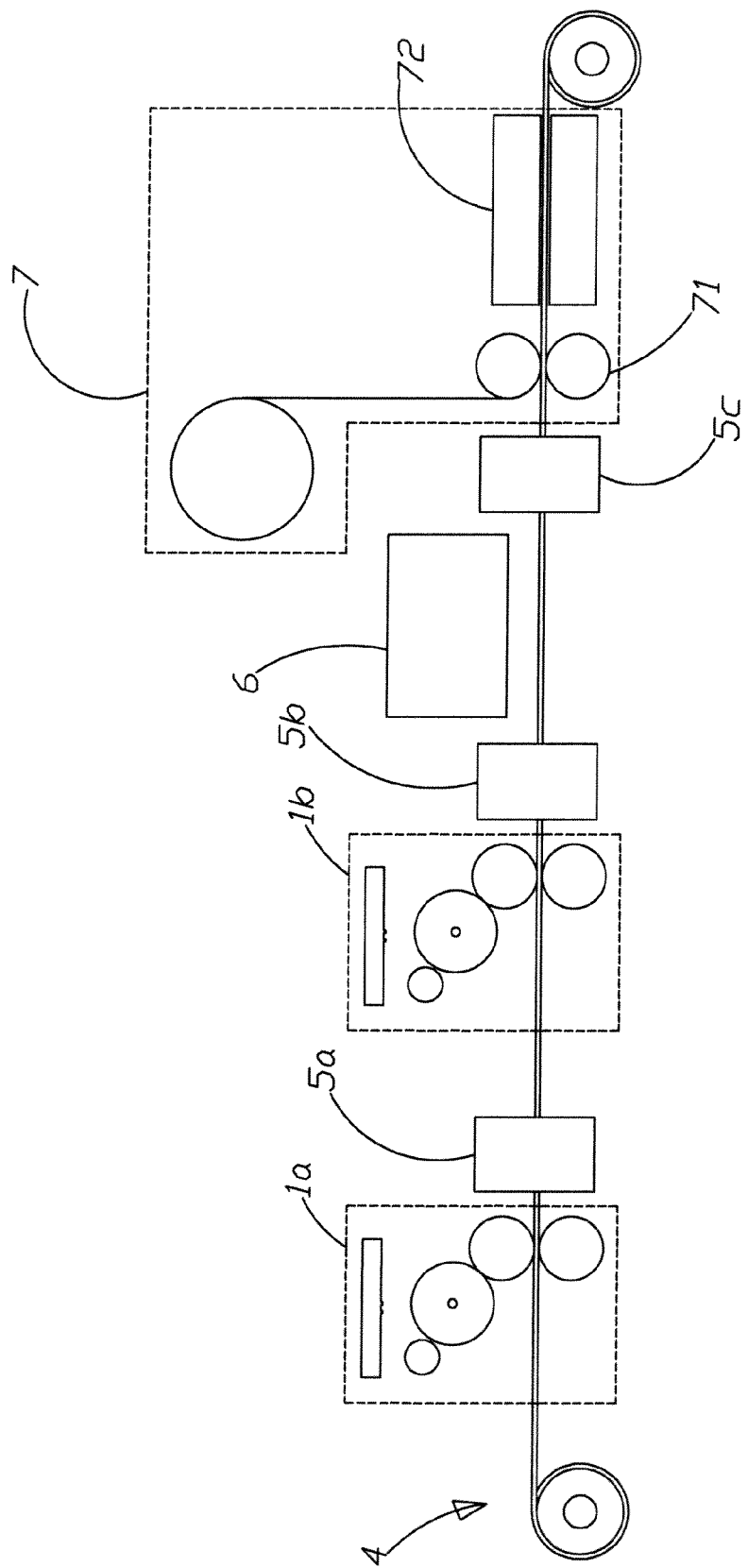
FIG. 13 is a schematic drawing showing a further embodiment of the present invention in using state.

Referring to FIG. 13, a further embodiment is revealed. The roller microcontact printing device of the present invention can be applied to produce various thin films. In this embodiment, the roller microcontact printing device is used in manufacturing of organic/polymer solar cells. The organic solar cell includes a plurality of thin film layers including a flexible substrate, an anode layer, a hole-transporting layer, an organic semiconductor layer and a cathode layer.

In this embodiment, an anode layer has already been disposed on the flexible substrate and the flexible substrate with the anode layer is sent to a first roller microcontact printing device 1a by a roll-to-roll conveyor module 4. Then a hole-transporting layer made from organic metal conductive polymers such as PEDOT:PSS (a polymer mixture of poly(3,4-ethylenedioxythiophene) and poly(styrenesulfonate)) is transferred onto the anode layer by the first roller microcontact printing device 1a. How the hole-transporting layer is transferred to the anode layer by the first roller microcontact printing device 1a has been revealed in the above embodiments. Next the flexible substrate with the hole-transporting layer is sent to a first drying unit 5a by the roll-to roll conveyor module 4. The drying way of the first drying unit 5a can be hot air drying, infrared drying, or UV irradiation.

Then the roll-to roll conveyor module 4 continues sending the flexible substrate with the hole-transporting layer to a second roller microcontact printing device 1b. An organic semiconductor layer made from organic semiconductor material such as P3HT:PCBM (poly(3-hexylthiophene) and [6,6]-phenyl-C61-butyric acid methyl ester blends) is transferred onto the hole-transporting layer by the second roller microcontact printing device 1b. And the flexible substrate with the organic semiconductor layer is sent to a second drying unit 5b by the roll-to-roll conveying module 4 for drying the semiconductor layer.

Later the flexible substrate with the organic semiconductor layer is sent to a screen printing module 6 that prints a thermosetting metal colloid (such as silver paste) on the organic semiconductor layer by a woven mesh so as to form a cathode layer on the organic semiconductor layer. At the same time, in consideration of that the metal colloid may infiltrate the semiconductor layer and reach the hole-transporting layer or even the anode and cause a short circuit, the semiconductor layer is covered with a protective layer. For example, a metal oxide (such as ZnO) is used to form the protective layer by drop coating. The screen printing can be a flat screen printing or a cylindrical screen printing. Then the flexible substrate with the cathode layer is sent to a third drying unit 5c by the roll-to-roll conveyor module 4 for drying the cathode layer.

The roll-to-roll conveyor module 4 continues sending the flexible substrate with the cathode layer to a package module 7. In the package module 7, a rolled protective membrane is sent by a plurality of rollers 71 to be pressed onto the flexible substrate with the cathode layer closely by a lamination press machine 72 so as to cover the cathode layer, the organic semiconductor layer, the hole-transporting layer and the anode layer on the flexible substrate.

The roller microcontact printing device of the present invention can be used together with a roll-to-roll conveyor module 4 to produce flexible solar cells or other flexible devices. Moreover, together with the roll-to-roll conveyor module 4, the production capacity of the roller microcontact printing device increases. The mass production reduces production cost and price of flexible products. Thus market share and utilization rate of the flexible products are further increased.

In summary, the roller microcontact printing device of the present invention includes the transfer roller by which the thin film layer is transferred to the substrate. The length of the thin film layer is determined by the diameter of the transfer roller and the number of laps of the transfer roller. Thus the area of the thin film layer can be adjusted by changing the diameter and the number of laps of the transfer roller. Therefore, the fixed area problem of the thin film layer transferred to the substrate in the stamp transfer printing can be solved.

The roller microcontact printing device of the present invention is applied to produce thin films, especially organic thin films. Moreover, the thin film production is not performed under high temperature and no chemical solution for etching is used. Thus the manufacturing cost is reduced and environmental friendliness is improved.

The roller microcontact printing device of the present invention is used in combination with the roll-to-roll conveyor module. The printing device and the roll-to-roll conveyor module are moved in the same way so that the combination is used for automatic and continuous production of thin films.

Additional advantages and modifications will readily occur to those skilled in the art. Therefore, the invention in its broader aspects is not limited to the specific details, and representative devices shown and described herein. Accordingly, various modifications may be made without departing from the spirit or scope of the general inventive concept as defined by the appended claims and their equivalents.

What is claimed is:

1. A roller microcontact printing device comprising:
    a transfer module with a transfer roller; and
    a supply module that is disposed above the transfer module, and provides at least one isolating solution that forms drops to fall to the transfer module, and the drops formed as at least one thin film material onto the transfer module sequentially;
    wherein the isolating solution is formed as an isolation layer on a surface of the transfer roller during rotating of the transfer roller, the surface of the transfer roller being patterned so that the thin film material is formed as a thin film layer on the isolation layer during rotating of the transfer roller; the thin film layer is transferred completely from the isolation layer to a substrate by the transfer roller while a interfacial free energy between the thin film layer and the substrate is larger than another interfacial free energy between the thin film layer and the isolation layer; the transfer module further includes:
    a first roller on one side of the transfer roller;
    a second roller on the other side of the transfer roller; the supply module provides the isolating solution and the thin film material to the second roller so as to form another isolation layer and the thin film layer on a surface of the second roller while the second roller is rotated; the thin film layer is transferred to the isolation layer of the transfer roller by the second roller.

2. The device as claimed in claim 1, wherein the roller microcontact printing device further includes a conveyor module located under the transfer module and used for conveying the substrate.

3. The device as claimed in claim 2, wherein the conveyor module is a roll-to-roll conveyor module that includes two rollers and each of two ends of the substrate is wound around the two rollers respectively; the two rollers rotate to convey the substrate.

4. The device as claimed in claim 1, wherein the roller microcontact printing device further includes
    a film thickness control member located on one side of the transfer roller; and
    a preset distance is between the film thickness control member and the transfer roller and thickness of the isolation layer and/or thickness of the thin film layer are/is controlled by the preset distance.

5. The device as claimed in claim 1, wherein the transfer module further includes:
    a first roller on one side of the transfer roller; the supply module provides the isolating solution to a surface of the first roller and forms the isolation layer on the surface of the first roller; the isolation layer on the surface of the first roller is transferred to the surface of the transfer roller by the first roller.

6. A roller microcontact printing device comprising:
    a transfer module with a transfer roller; and
    a supply module that is disposed above the transfer module, and provides at least one isolating solution that forms drops to fall to the transfer module, and the drops formed as at least one thin film material onto the transfer module sequentially;
    wherein the isolating solution is formed as an isolation layer on a surface of the transfer roller during rotating of the transfer roller, and the thin film material is formed as a thin film layer on the isolation layer during rotating of the transfer roller; the thin film layer is transferred completely from the isolation layer to a substrate by the transfer roller while a interfacial free energy between the thin film layer and the substrate is larger than another interfacial free energy between the thin film layer and the isolation layer; the transfer module further includes:
    a first roller on one side of the transfer roller;
    a second roller on the other side of the transfer roller; and
    a third roller on one side of the second roller; the supply module provides the isolating solution to a surface of the third roller so as to form another isolation layer on the surface of the third roller; the isolation layer on the surface of the third roller is transferred to a surface of the second roller by the third roller; the supply module provides the thin film material to the second roller to form the thin film layer on the isolation layer of the second roller; the thin film layer is transferred to the isolation layer of the transfer roller by the second roller.

7. A roller microcontact printing method comprising the steps of:
    modifying a surface of a transfer roller of a transfer module to increase an interfacial free energy on the surface of the transfer roller;
    dripping drops of an isolating solution to the transfer module so that the drops of the isolating solution formed as an isolation layer on the surface of the transfer roller of the transfer module;
    dripping drops of a thin film material to the transfer module so that the drops of the thin film material formed as a thin film layer on the isolation layer of the transfer roller; and
    transferring the thin film layer completely from the isolation layer to a substrate by the transfer roller while a interfacial free energy between the thin film layer and the substrate is larger than another interfacial free energy between the thin film layer and the isolation layer; the transfer module further includes:
    a first roller on one side of the transfer roller; and
    a second roller on the other side of the transfer roller; the isolating solution and the thin film material being provided to the second roller so as to form another isolation layer and the thin film layer on a surface of the second roller while the second roller is rotated; the thin film layer being transferred to the isolation layer of the transfer roller by the second roller.

8. The method as claimed in claim 7, wherein the method further includes a step of conveying the substrate.

9. The method as claimed in claim 7, wherein the transfer module further includes:
    a first roller on one side of the transfer roller; the isolating solution being provided to a surface of the first roller and forming the isolation layer on the surface of the first roller; the isolation layer on the surface of the first roller being transferred to the surface of the transfer roller by the first roller.

* * * * *